United States Patent [19]

Nilsson et al.

[11] Patent Number: 4,471,317
[45] Date of Patent: Sep. 11, 1984

[54] FAST RESPONSE, EQUALIZED AGC AMPLIFIER

[75] Inventors: C. Gary Nilsson, Redondo Beach; David J. Hedberg, Rancho Palos Verdes, both of Calif.

[73] Assignee: Digital Engineering, Ltd., Torrance, Calif.

[21] Appl. No.: 444,084

[22] Filed: Nov. 12, 1982

[51] Int. Cl.³ .............................................. H03G 3/30
[52] U.S. Cl. .................... 330/141; 330/281
[58] Field of Search .............. 330/279, 281, 129, 134, 330/141

[56] References Cited

U.S. PATENT DOCUMENTS 3,441,866  4/1969  Barber et al. ...................... 330/141

Primary Examiner—James B. Mullins
Assistant Examiner—Steven J. Mottola
Attorney, Agent, or Firm—Robert B. Block

[57] ABSTRACT

An AGC amplifier having a fast response for recovery and reacquisition of gain control in microseconds after a signal break including a first and second amplifiers interconnected by a delay line equalizer. An integrator control loop is responsive to the output of the second amplifier and is connected to the control means provided on the first amplifier and includes a feedback loop having a peak detector, an ideal integrator connected to the output of the peak detector and directly controlling the first amplifier using an ideal integrator capacitor loop during control operation and having a switch removable reset loop for operating as a fixed high gain amplifier in the absence of signal. The latter is determined by a comparator operating to receive a second peak detector signal not in the control loop.

4 Claims, 1 Drawing Figure

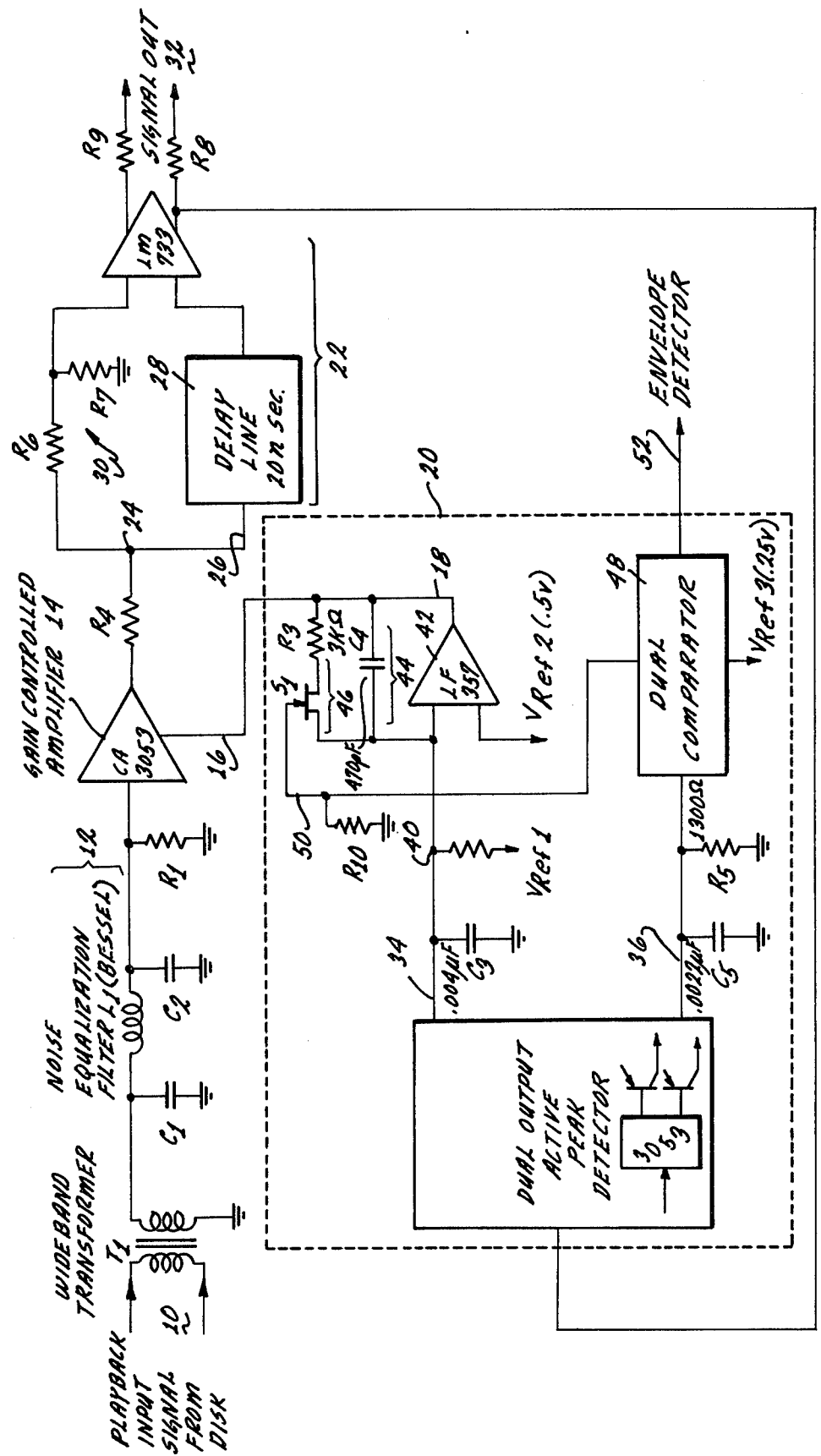

FAST RESPONSE, EQUALIZED AGC AMPLIFIER

CROSS REFERENCE TO RELATED APPLICATIONS

Cross-reference is made to U.S. Pat. application Ser. No. 441,790 filed 15, Nov. 1982 entitled *Digital Video Disk Recording System* in the names of Hedberg, et al. owned by the owner of the present application and incorporated herein by reference.

BACKGROUND OF THE INVENTION

This invention relates to AGC amplifiers and more particularly to AGC circuits capable of fast response time. The invention is particularly useful in demodulating data from multiple track magnetic disk video recording systems where a complete entire video field comprising a plurality of lines separated by vertical blanking intervals is recorded on a track and one or more heads progress incrementally from one track to another for each field.

In such applications, the head is moved to a new track in sequence or randomly and begins to output a data signal at some level. The AGC demodulator circuits have to adjust gain automatically so as to provide a constant level output signal. The time available for adjusting the gain and recovering gain control after moving the head between fields of the signal and after a video blank pulse between the lines of each field in video disk recording applications is so small as to require AGC response in as little as one to five microseconds. Such requirements are not been met by currently available circuits. There is therefore a need for an AGC amplifier which is capable of reliable fast response in the above mentioned circuits.

SUMMARY OF THE INVENTION AND OBJECTS

It is a general object of the present invention to provide a fast response, equalized AGC amplifier which will overcome the above limitations and disadvantages.

It is a further general object of this invention to provide for full AGC control acquisition on a control preamble transmitted during video blanking. As a practical matter, this means that the AGC circuit of this invention will have to operate with a response time less than five microseconds, and more on the order of one to two microseconds, a far shorter response time than is currently available from such circuits.

A further object of the invention is to provide an AGC circuit of the above character which locks into control during the video preamble signal in the video blanking interval.

A further object of the invention is to provide an AGC amplifier of the above character which provides a stable high gain standby function and which switches automatically to an automatic gain control function within one to five microseconds.

A further object of the invention is to provide an AGC amplifier of the above character which has incorporated therein an equalization function to render the circuit insensitive to change in frequency and further provides for resistance to a control loop oscillation.

Preferably, the present invention is employed in video disk recorder of the type disclosed in the cross-reference copending U.S. Pat. application, Ser. No. 441,790 a video field is recorded in real time on a single disk track. The field comprises a standard number of lines, for example 262½ in the United States. Each of these lines is separated by a video blanking interval which may be about eight to ten seconds. Assuming that it is eight seconds, the video blanking interval comprises an initial three microseconds of blank signal which is dead and contains no information. This dead time serves as a guard band for separating lines. This guard band is followed by about five microseconds of preamble information which is used for video signal control.

The invention used is part of the read/write signal process system is a video recorder of the referenced application. More specifically, it is part of the digital FM demodulator of each of the identical five modem channels in the system. Each of these digital FM modems is divided into two sections, the modulator section and the demodulator section. This invention pertains to the demodulator section. It is basically a very fast responding automatic gain control circuit which is able to stabilize the gain once the head comes on track and between line within a very short period of time such that data demodulation can begin. It extends the performance of conventional implementation which operate with about a six microsecond or more response time and improves that response time to one microsecond or better.

In its simplest concept an automatic gain control circuit serves to maintain the amplitude of a received signal as applied to a detector is nearly constant as possible and thus correct for variations in the signal strength caused by variations in recording media or in the case of bradcast, fading. When a modulated signal is detected the output contains a DC component having a magnitude proportional to the amplitude of the carrier which is being detected. The other components are ignored for control purposes. This DC level can be obtained from a peak detector and applied as a bias signal to control the gain of prior stages such as IF stages in radio frequency amplifiers or the amplifiers immediately preceding the detector. This voltage serves as a control voltage for changing the gain of these amplifiers so as to maintain the detector output constant regardless of the overall strength of the signal. The AGC circuit has been proposed in many forms. For use in the present application, it might be supposed that an ideal integrator circuit could provide the requisite control signal. However, in practice, such integrators are found to have response times which are too long to be useful. The present invention is predicated on a finding that the reason for the long response time is due to the fact that the integrator tends integrate towards and become stably locked on one of the supply voltages (rails) when no input is present. Its recovery may be from ten to twenty microseconds. It has been found that if, in the absense of signal, the AGC control path uses an ideal integrator which is stabalized in its active region at a high, but finite, gain in a standby mode (during blanking) that it is capable of responding nearly instantaneously to an incoming signal within the one to five microseconds available. Where the blanking interval incorporates a control signal, the same is used by the fast AGC of this invention to pre-establish the active control gain applied at the beginning of each line. Moreover the various parameters of signal gain and control loop gain can be very satisfactorily adjusted as well.

The present invention accomplishes the foregoing by providing a dual amplifier circuit in which a first amplifier is connected to a differential equalizer through a delay line to provide linear phase equalization with a cosine amplitude function. The equalizer is preferably of the form of a two arm signal splitter having a delay line in one arm followed by a differential amplifier. The output of the equalizer is peak detected and used to drive a switched integrator the output of which serves as the control signal to the first amplifier. The integrator has a first open integrating capacitor loop connected from the output to the input thereof the capacity of which establishes a stable control function. The integrator further has a reset loop including a series connected resistor and solid state switch connected in parallel across and bypassing the integrating capacitor. The solid state switch is controlled by a peak detector output independent from the first peak detector and having a comparator for responding whenever the peak signal level exceeds a predetermined threshhold value to indicate the presence of a minimum acceptable signal. The latter operates to open and close the switch in response to signal presence so that in the absence of a signal the integrator is placed in a standby mode of predetermined high gain and switches nearly instantly full AGC control as soon as a minimum signal is present.

These and other objects and features of the invention will become apparent from the following description in claims when taken in conjunction with the accompanying drawings of which:

A BRIEF DESCRIPTION OF THE DRAWING

The drawing is a circuit schematic, partially in block diagram form, of a fast response, equalized AGC amplifier constructed in accordance with the present invention.

DETAILED DESCRIPTION OF THE PREFERRED EMBODIMENT

Referring now to the drawing, the AGC amplifier circuit of the present invention is shown in detail and receives a digital video signal at 10 to be processed which is converted from differential to single ended format by transformer 11 which is then passed through a noise and equalization filter 12 comprising CI, LI, and C2 to the input of a gain controlled amplifier 14. Amplifier 14 is capable of responding to intermittent breaks in the signal for acquiring gain control in a few microseconds and is typically of the rf amp type such as a 3053 implemented on an IC differential amplifier. The amplifier 14 is provided with a control signal imput 16 for establishing its gain which is connected to the output 18 of an integrator control loop 20 to be described.

A second differential amplifier 22 is connected to the output 24 of the first amplifier through a parallel network, one arm 26 of which contains a 5-pole, linear phase, delay line 28 which also serves as an equalizer in cooperation with the equalization filter 12. The other arm 30 is taken through a resistor R6, each of the arms being connected to the input of the second amplifier in a single-ended to differential configuration, the differential output of which at 32 is the equalized signal to the demodulator.

Means are provided for forming a first feedback loop including a peak detector taken from the dual output of an active peak detector circuit which may consist of a 3053 op amp followed by a parallel pair of signal splitting transistors having outputs at lines 34 and 36. The first loop includes series connected filter network 38 having a control function output developed at a current-controlled summing node 40 and connected to the input of an integrating op amp 42. The integrator output 18 is connected to the control input 16 of the first amplifier 14. The integrator is provided with a full open integrating capicitor feedback loop 44 comprising capacitor C4 connected from its output to its input which is bypassed by a second, preset loop 46 including a series connected resistor R3 and a series connected solid state switch 51 which loop is connected in parallel across and bypasses the integrating capacitor C4. The solid state switch 51 is operated between closed and open positions by a comparator circuit located in the other feedback loop 36.

The dual peak detector's second output on line 36 operates in a voltage mode which follows the peaks of the signal and applies them to a dual comparator 48 for responding whenever the signal peak exceeds a predetermined threshhold value. The outputs of the comparator are a TTL between ground and +5 volts and the other between ground and −6 volts. One output of the comparator serves as the switch control signal which is shown schematically in dashed lines 50 as taken to the switch 51. The other output of the comparator serves as an envelope detect signal at 50 indicating presence of envelope and is used for further control and indicator purposes including locking the demodulator VCO to a stable frequency.

The three pole filter 12 plays a dual role. First it eliminates wideband noise, particularly out of band noise and secondly it serves as the first stage of amplitude equalization.

The operation of the invention the integrator comprises two switched states. In the first, integrator op amp 18 is connected as a high gain amplifier; in the second, it is connected as an ideal integrator. As an amplifier it is set at near maximum gain so that when a signal is received, it starts from within its active control region and has a small correction to make.

Once the signal is received, the detector loop including the first part of the peak detector and the integrator is made part of the control loop and works in current mode; while the other part of a circuit starting at 36 continues to work in a voltage mode and continues to follow the peaks. The second peak detector and comparator is needed because the part of the envelope detector that is in the control path will not respond quickly to loss of signal. When the signal disappears, there is a time delay because an ideal integrator is in the loop and the peak detector which is connected to the integrator input cannot respond fast because the integration capacitor will discharge through the peak detector filter and tends to hold it up. If the discrete detect output were the same the delay would not be acceptable.

On the other hand, if one uses the control function output as the envelope detect output, there will also be a delay because the integration capacitor discharges through that filter and will not switch modes fast enough. In contrast, the parallel running output provided by the dual peak detector of this invention responds very quickly because one of the detectors is not at the summing node, i.e., out of the AGC loop. The loop attempts to control the gain such as to keep that node at the reference voltage (+0.5 volts). When the signal disappears at the input the integration capacitor discharges through the summing node and artificially holds it up so that the control function output tends to indicate there is still an envelope present when in fact it has gone. This is cured by the provision of the second detector output which follows immediately the loss of input signal even within a microsecond after the envelope has disappeared at the input. While the two filter circuits C3, R2 and C5, R5 could be the same, they are different. While both filters and the detector filter pulses, the filter comprising C3, R2 in the active integrator loop sets the bandwidth for AGC control loop conditions, while the other filter sets the amplitude detector bandwidth for the envelope detect function. The upper end frequency response of these filters needs to be different so that in the dual circuit provided, these differences can be optimized independently resulting in improved overall performance of the entire system. The optimum performance will require different filters because the filter in the control function loop is optimized for best overall AGC loop response as a control function, while the second signal filter is optimized to respond quickly while still giving a sufficient amount of noise margin in the amplitude envelope detect function. The latter thus responds quickly to the envelope whether present or not. The control function filter is optimized by putting a test signal into the input, amplitude modulating the test signal with the square wave and adjusting the output of the AGC amplifier for optimum transient response. Likewise, the integration capacitor C4 and the loop gain and the filter complements of C3, R2 are adjusted for optimum response. Once adjusted the components are fixed for a given set of active circuit components. The specific values are particular to the complete set of specific circuit values including those of the active components. In general, the control loop is a second order control function and after certain resistor values have been chosen which are satisfactory for the impedences involved, the capacitors can be adjusted.

With the present invention, loop responses of a microsecond for lock on time have been made possible. The ideal integrator in the AGC control loop makes the control function very wideband, and, by switching the integrator in and out the circuit, has also been made one of extremely fast response. The circuit of the present invention has been found very effective since it responds nearly instantly to the initial detect envelope without undergoing transient errors in attempting to lock from a position outside its linear response. The circuit is arranged to provide amplitude measurement stabilized at the time the loop integrator function is removed and from this stabilized value the correct gain of the new loop control is readily obtained.

By providing a simple implementation with relatively few components, the amount of lag and phase shift that occurs in the various components of more complex systems has been eliminated and would have been excessive for purposes of establishing the 100 KHz or higher bandwidth of operation of the circuit. In that regard, not only is the delay line necessary, but the two equalization functions provided by circuits 12 and 28 also help prevent loop oscillation because they shape the amplitude frequency response to a cosine function which at low frequencies lowers AGC loop gain. This is found desirable since the AGC loop tends to oscillate when the input signal is of lower frequency than about 6 MHz. The foregoing tendency is attributed to non-ideal operation of peak detectors.

For circuit simplicity, a halfwave rectifier is adequate as a peak detector, although a full wave version might be more satisfactory if sufficient space is available. Thus the delay line and the second stage differential amplifier provides an extra margin from incipient oscillation as well as providing their primary functions.

The delay line is optimized to provide amplitude equalization that smoothes out the amplitude function that is received from the disk. The latter are a function of frequency in part so that the higher frequencies have lower amplitudes. This causes problems in the detection decode program. The main function of the equalizer is to equalize the amplitude so that it is insensitive to frequency, i.e., every frequency used becomes equal in amplitude. In addition, the added benefit is obtained in that it fights loop oscillation.

The delay line 28 may be of the linear phase filter type which has a linear phase shift over the frequencies of interest, i.e., the time delay through the filter is constant. Thus, a 5 pole, linear phase filter used in a linear phase version provides a suitable delay line function.

What is claimed is:

1. An AGC circuit for amplifying a signal from a source thereof and capable of responding to intermittent breaks in said signal for reacquisition of gain control within a few microseconds comprising a first amplifier for receiving said signal and including control means for varying the gain thereof,
    means forming a second amplifier,
    means connecting the first and second amplifiers for establishing a signal delay, said signal being processed in series through said first amplifiers, said delay means and said second amplifier,
    a first feedback loop responsive to the delayed output of said second amplifier and connected to said control means of the first amplifier,
    said first feedback loop comprising a peak detector means for receiving said delayed output,
    integrator means having an input connected to the peak detector and an output connected to the control means of said first amplifier,
    said integrator having a full open integrating capacitor loop connected from the output to the input thereof,
    and a reset loop including a series connected resistor and switch connected in parallel across and bypassing said integrating capacitor loop,
    second peak detector means having an output independent of the first peak detector output for following the peaks of said input signal,
    comparator means connected to said second peak detector output for responding whenever the signal peaks exceeds a predetermined threshhold value indicating presence of a minimum signal level and having an output connected for opening said switch means in response to said signal presence.

2. The AGC circuit of claim 1 further including a low pass filter for equalizing said signal and removing out-of-band noise connected in signal path to said first amplifier.

3. An AGC circuit for amplifying a signal from a source thereof and capable of responding to intermittent breaks in said signal for reacquisition of gain control within a few microseconds comprising an amplifier for receiving said signal and including control means for varying the gain thereof,
    means forming a linear phase equalizer having cosine amplitude equalization function to eliminate apparent amplitude modulation of the signal due to high frequency roll-off which prevents the pulse amplitude from affecting the AGC control loop, a first feedback loop responsive to the equalizer output signal and connected to said control means of the first amplifier, said first feedback loop comprising a peak detector means for receiving said delayed signal, integrator means having an input connected to the peak detector and an output connected to the control means of said amplifier, said integrator having a full open integrating capacitor loop connected from the output to the input thereof, and a reset loop including a series connected resistor and switch connected in parallel across and bypassing said integrating capacitor loop, second peak detector means having an output independent of the first peak detector output for following the peaks of said input signal, comparator means connected to said second peak detector output for responding whenever the signal peaks exceeds a predetermined threshhold value indicating presence of a minimum signal level and having an output connected for opening said switch means in response to said signal presence.

4. The AGC circuit of claim 3 further including a low pass filter for equalizing said signal and removing out-of-band noise connected in signal path to said first amplifier.

* * * * *